US011933862B2

(12) United States Patent
Koolen et al.

(10) Patent No.: US 11,933,862 B2
(45) Date of Patent: Mar. 19, 2024

(54) PROTECTIVE EARTH (PE) LOSS DETECTION

(71) Applicant: ABB Schweiz AG, Baden (CH)

(72) Inventors: Gertjan Koolen, Eindhoven (NL); Balazs Villanyi, Delft (NL); Lars Bech, Schiedam (NL); Jim van-der-Heijden, Eindhoven (NL)

(73) Assignee: ABB Schweiz AG, Baden (CH)

( * ) Notice: Subject to any disclaimer, the term of this patent is extended or adjusted under 35 U.S.C. 154(b) by 721 days.

(21) Appl. No.: 17/083,334

(22) Filed: Oct. 29, 2020

(65) Prior Publication Data
US 2021/0048485 A1  Feb. 18, 2021

Related U.S. Application Data

(63) Continuation of application No. PCT/EP2019/060905, filed on Apr. 29, 2019.

(30) Foreign Application Priority Data

Apr. 30, 2018  (EP) ................... 18170179

(51) Int. Cl.
G01R 31/52  (2020.01)
B60L 53/16  (2019.01)
B60L 53/18  (2019.01)

(52) U.S. Cl.
CPC ............. *G01R 31/52* (2020.01); *B60L 53/16* (2019.02); *B60L 53/18* (2019.02)

(58) Field of Classification Search
USPC ....................................... 320/109
See application file for complete search history.

(56) References Cited

U.S. PATENT DOCUMENTS

| 7,886,857 | B2 | 2/2011 | Fujitake |
| 2003/0145256 | A1* | 7/2003 | Jehlicka ............... H02J 7/1423 714/48 |
| 2013/0313918 | A1* | 11/2013 | Nolewaika ............ B60L 53/18 307/131 |
| 2015/0002104 | A1* | 1/2015 | Moell .................. H02H 3/08 361/93.7 |
| 2015/0097525 | A1 | 4/2015 | Dedona et al. |
| 2017/0253134 | A1* | 9/2017 | Berger ................. B60L 3/0092 |

(Continued)

FOREIGN PATENT DOCUMENTS

WO  WO 2014006096 A2  1/2014

OTHER PUBLICATIONS

"Electric vehicle conductive charging system—Part 23: DC electric vehicle charging station", IEC 61851-23:2014, IEC, Geneva, Switzerland.

(Continued)

*Primary Examiner* — Mohammed Alam
(74) *Attorney, Agent, or Firm* — Leydig, Voit & Mayer, Ltd.

(57) ABSTRACT

A Protective Earth (PE) loss detection method for charging an electrical vehicle is provided. The electrical vehicle comprises an Electrical Vehicle Supply Equipment (EVSE), a charging connector, and/or a charging cable comprising at least a Proximity Pilot (PP) line for a PP signal, a Control Pilot (CP) line for a CP signal and a PE line for a PE signal. The method comprises detecting interruption of the PE line by observing a change of the PP signal.

21 Claims, 4 Drawing Sheets

(56) References Cited

U.S. PATENT DOCUMENTS

2018/0091191 A1* 3/2018 Berger ............... B60L 53/68
2019/0131803 A1* 5/2019 Cong ............... H02J 50/001
2021/0048485 A1* 2/2021 Koolen ............... B60L 53/18

OTHER PUBLICATIONS

"Vehicle-to-Grid Communication Interface—Part 2 Technical protocol description and Open Systems Interconnections (OSI) layer requirements" IEC15118-2 , 2014.
"Physical layer and Data Link layer requirements—CDV" IEC15118-3 , Feb. 8, 2013.
"Electric vehicle conductive charging system—Part 1: General Requirements", IEC 61851-1, Edition 3.0, Feb. 2017.
"Electric vehicle conductive charging system—Part 24: Digital Communication between a d.c. EV charging station and an electric vehicle for control of d.c. charging", IEC 61851-24:2014 -03.
"Plugs, Socket-outlets and Couplers for industrial and similar applications, and for Electric Vehicles—Part 2: Dimensional compatibility and interchangeability requirements for a.c. pin and contact— tube accessories" IEC 62196 -2, Edition 2.0 Feb. 2016.
"Electromobility—Digital communication between a d.c. EV charging station and an electric vehicle for control of d.c. charging in the Combined Charging System" DIN Spec 70121:2014.
"SAE Electric Vehicle and Plug in Hybrid Electric Vehicle Conductive Charge Coupler " SAE J1772; Feb. 2016.

\* cited by examiner

PROTECTIVE EARTH (PE) LOSS DETECTION

CROSS-REFERENCE TO PRIOR APPLICATION

This application is a continuation of International Patent Application No. PCT/EP2019/060905, filed on Apr. 29, 2019, which claims priority to European Patent Application No. EP 18170179.8, filed on Apr. 30, 2018. The entire disclosure of both applications is hereby incorporated by reference herein.

FIELD

The invention relates to an electrical vehicle Protective Earth, PE, loss detecting method for charging the electrical vehicle, comprising an Electrical Vehicle Supply Equipment, EVSE, a charging connector and/or a charging cable providing at least a Proximity Pilot, PP, line for a PP signal, a Control Pilot, CP, line for a CP signal line and a PE line for a PE signal. The invention further relates to a charging connector, a charging cable and an EVSE configured for detecting PE loss according to the electrical vehicle PE loss detecting method.

BACKGROUND

Electric vehicle, EV, direct current, DC, fast charging methods often use a so called Combined Charging System, CCS, protocol according to International Electrotechnical Commission (IEC) 61851-23 standard for charging electrical vehicles both in the United States, US, and in the European Union, EU. The protocol comprises various safety mechanisms, which include a ground loss detection using a Control Pilot, CP, line. If a charging connector respectively coupler used for charging the electrical vehicle is unplugged during a charging session from the electrical vehicle, the CP line becomes interrupted and, according to said protocol, the charging of the electrical vehicle has to be stopped within 30 milliseconds, for avoiding arcs and high voltage exposure.

However, said mechanism does not work at a reliant manner for detecting ground loss at the charging connector, as an underlying CP circuit of the CP line may find another route via a Proximity Pilot, PP, line. During normal operation, the CP line guards continuity of the CP line and a Protective Earth, PE, line, whereas the PP line is used by the electrical vehicle for determining a locking status of the charging connector. If the CP line is interrupted, a CP return signal may not go via the PE line as during normal operation but rather via resistors within an underlying PP circuit of the PP line in the charging connector. In such case an Electrical Vehicle Supply Equipment, EVSE, providing the electrical energy for charging the electrical vehicle, cannot detect ground loss respectively PE continuity reliably anymore by observing the CP line, such that arcs and high voltage exposure may become possible.

SUMMARY

In an embodiment, the present invention provides a Protective Earth (PE) loss detection method for charging an electrical vehicle comprising an Electrical Vehicle Supply Equipment (EVSE), a charging connector, and/or a charging cable comprising at least a Proximity Pilot (PP) line for a PP signal, a Control Pilot (CP) line for a CP signal and a PE line for a PE signal, the method comprising: detecting interruption of the PE line by observing a change of the PP signal.

It is therefore an object of the invention to provide a more reliant measure for detecting ground loss respectively PE continuity for an Electrical Vehicle Supply Equipment, EVSE.

The object of the invention is solved by the features of the independent claims. Preferred embodiments are detailed in the dependent claims.

Thus, the object is solved by an electrical vehicle Protective Earth, PE, loss detection method preferably using a Combined Charging System, CCS, protocol for charging the electrical vehicle, comprising an Electrical Vehicle Supply Equipment, EVSE, a charging connector and/or a charging cable providing at least a Proximity Pilot, PP, line for a PP signal, a Control Pilot, CP, line for a CP signal and a PE line for a PE signal, and the method comprises the step of:

Detecting interruption of the PE line by observing a change of the PP signal.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
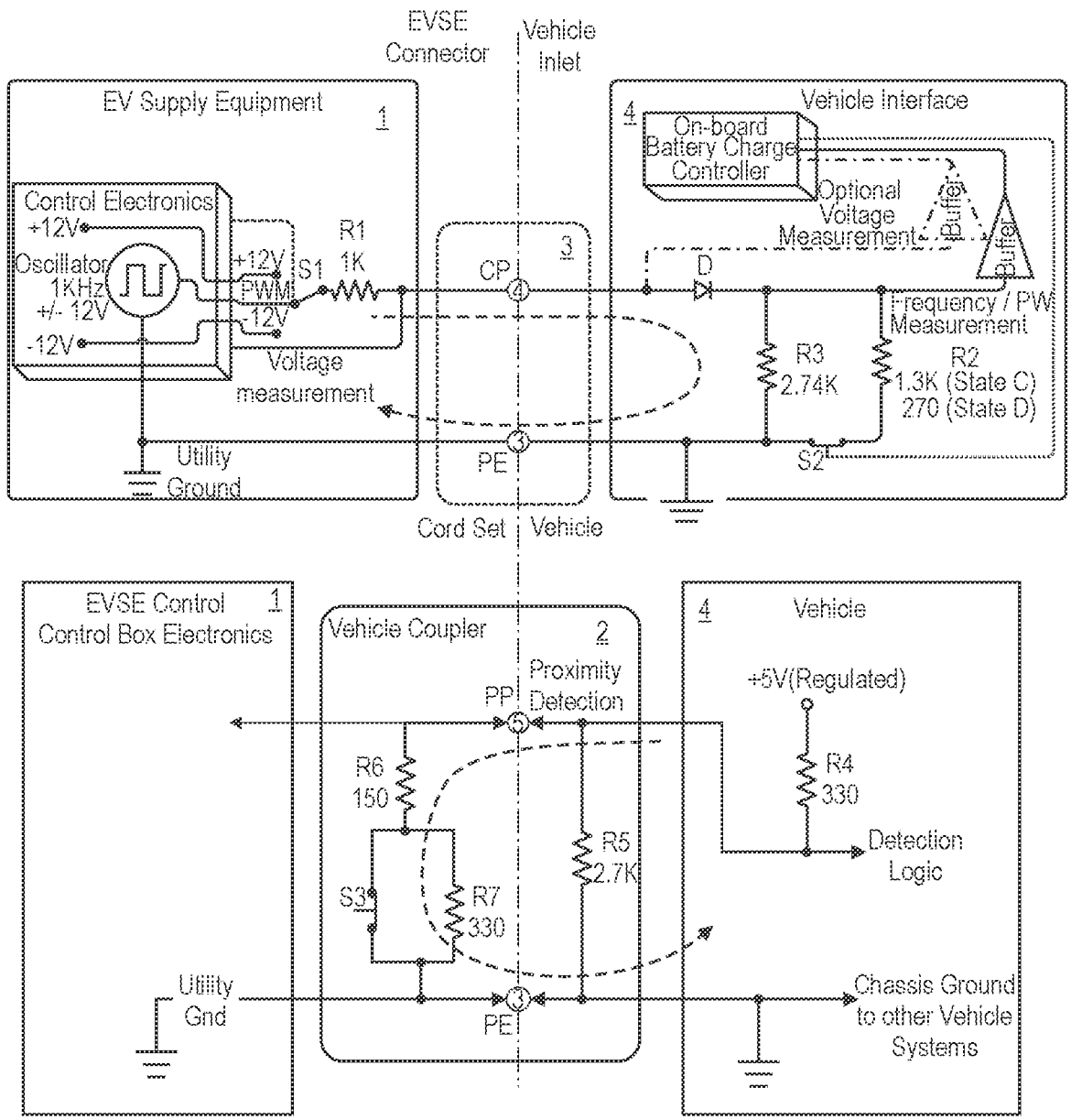
FIG. 1 shows a normal signal flow between an Electrical Vehicle Supply Equipment, EVSE, a charging connector, a charging cable and an electrical vehicle in a schematic view.

A key point of the invention is therefore that, for example, the Electrical Vehicle Supply Equipment, EVSE, executing the proposed method observes the PP line in order to check PE continuity. Said check can be done in addition to or alternatively to an existing CP check i.e. to an existing observation of the CP line. Thus, the proposed method allows even if the CP is broken a reliable determination if the PE line is broken, thereby avoiding arcs and high voltage exposure compared to implementations which only observe the CP line for ground loss. Such way it becomes possible that charging of the electrical vehicle is reliably stopped within 30 milliseconds, as required by said protocol.

The Combined Charging System, CCS, protocol is a fast charging method for charging electric vehicles delivering high-voltage direct current via a charging connector derived from SAE J1772 standard (IEC Type 1) or IEC Type 2 connector. The charging connector can be a combination of an AC connector with a DC option and is called in such case Combo Coupler, while variant with IEC Type 2 is often abbreviated as Combo2. Automobile manufactures that support CCS include Jaguar, Volkswagen, General Motors, BMW, Daimler, Ford, FCA, Tesla and Hyundai. The CSS standard is controlled by the so called CharIN consortium. The charging connector is also referred to as electrical connector or coupler.

PP, CP and/or PE line and respectively signaling are preferably implemented according to the CCS protocol, in particular according to IEC 61851 or IEC 61851-23 standard. The method is applicable to different type of electrical vehicles, including for examples electrical busses. Detecting interruption of the PE line by observing a change of the PP signal means for example measuring the PP signal voltage and comparing the measured PP signal voltage with a pre-defined and/or standard PP signal voltage for determining if a change has occurred.

Besides that, the change may comprise different measures. However, according to a preferred implementation, the change comprises a different direct current, DC, level. In particular, the change may comprise determining that the DC level is reduced compared to a previous DC level.

In another preferred embodiment, the different DC level is ≤40, 50 or 60% of a DC level of an uninterrupted PE line. Thus, compared to an uninterrupted PE line, for example, during normal operations, said change is determined if the DC level has dropped by at least 40% compared to a previous state. Therefore, the term change is preferably understood as a difference to a previous state, whereby change/difference may comprise a shift and/or a drop in a DC voltage and/or as comprising an additional AC component.

According to another preferred implementation, the different DC level is ≤0.3 V, ≤0.4 V or ≤0.6 V in particular using the CCS1 protocol or the different DC level is ≤1.2 V, ≤1.6 V or ≤2.0 V in particular using the CCS2 protocol. CCS1 protocol is normally used in the US, while CCS2 protocol is normally used in the European Union. CCS1 protocol allows charging up to 80 kW at maximum 400 V and 200 A, and may comprise load balancing, charge authorization mode and/or charging stations communication compliant to DIN SPEC 70121:2014. CCS2 protocol allows charging up to 350 kW in the range 200 to 1000 V, whereby charging stations communication may support 0 to 350 kW with ISO15118-2:2014 and IS015118-3:2015 and 0-80 kW with DIN SPEC 70121:2014. Proposed implementation may be used in an analogous manner with CCS2 protocol, for which so far only a draft is available. Besides that the proposed method may be used in combination or applied to DIN SPEC 70121—electromobility—Digital communication between a DC EVSE and an electric vehicle for control of DC charging in the Combined Charging System—and/or ISO15118 for >80 kW.

During normal operation i.e. with a not interrupted PE line, the PP line voltage is approximately 1.5 V steady for US/CSS1 protocol and 3.7 V steady for EU/CSS2 when the EV uses the circuit recommended in the IEC 61851-23 standard. If, in particular after occurrence of such change, a PP line voltage is left but <0.3 V using the CCS1 protocol or ≤1.2 V using the CCS2 protocol, it can be assumed that the EVSE is idle not charging the electrical vehicle and that the charging connector is plugged into the electrical vehicle. If a PP line voltage is left ≥0.3 V and preferably ≤0.6 V using the CCS1 protocol or ≥1.2 V and preferably ≤1.6 V using the CCS2 protocol, it can be assumed that the EVSE is charging the electrical vehicle and that the charging connector is plugged into the electrical vehicle. Thus, depending on the voltage different states of charging/not charging the electrical vehicle can be determined.

In a further preferred implementation, the change comprises an alternating current, AC, component and/or a pulse width modulated, PWM, signal. Said AC component and/or PWM signal may be a residue from a PWM on the CP line, which typically has a frequency of 1 kHz +12V/−12V PWM of 5% pulse width. Thereby, the amplitude of the AC component and/or PWM signal on the PP line can be around 50% higher during charging the electrical vehicle compared to not charging the electrical vehicle, both with the charging connector plugged into the electrical vehicle.

In this regard it is according to another implementation preferred that the AC component and/or the PWM signal comprises a peak to peal amplitude of ≥0.1 V or ≥0.3 V and <0.3 V, ≤0.4 V or ≤0.6 V in particular using the CCS1 protocol or comprises a peak to peak amplitude of ≥0.4 V or ≥1.0 V and ≤1.2 V, ≤1.6 V or ≤2.0 V in particular using the CCS2 protocol. If, in particular after occurrence of such change, if the AC component and/or the PWM signal comprises an amplitude of ≥0.1 V and <0.3 V using the CCS1 protocol or ≥0.4 V and ≤1.0 V using the CCS2 protocol, it can be assumed that the EVSE is idle not charging the electrical vehicle and that the charging connector is plugged into the electrical vehicle. If the AC component and/or the PWM signal comprises an amplitude of ≥0.3 V using the CCS1 protocol or ≥1.0 V using the CCS2 protocol, it can be assumed that the EVSE is charging the electrical vehicle and that the charging connector is plugged into the electrical vehicle. Thus, depending on the amplitude of the AC component and/or the PWM signal different states of charging/not charging the electrical vehicle can be determined.

According to another preferred implementation, the AC component and/or PWM signal comprises a frequency in the range of 1 kHz or a frequency ≥0.9 kHz and ≤1.1 kHz. As outlined before, said AC component and/or PWM signal may be residue from a PWM on the CP line. Thus, presence of such AC component and/or PWM signal indicates a broken PE during charging connector plugged into the electrical vehicle.

Generally, the described method can be used with a range of different charging protocols. However, according to an especially preferred implementation the charging protocol is according to IEC 61851, in particular according to IEC 61851-23. IEC 61851, in particular IEC 61851-24:2014, in particular together with IEC 61851-23, apply to digital communication between an Electrical Vehicle Supply Equipment, in particular a DC EV charging station, and an electric vehicle for control of DC charging, typically within an AC or DC input voltage up to 1000 V AC and up to 1500 V DC for conductive charging procedure. The EV charging mode is preferably mode 4, according to IEC 61851-23.

According to another preferred implementation, the method comprises the charging connector, wherein the charging connector is provided according to IEC 62196. Said standard is based on IEC 61851 electric vehicle conductive charging system, which, as described before, establishes general characteristics, including charging modes and connection configurations, and requirements for specific implementations including safety requirements of both electric vehicle and EVSE in a charging system. For example, the standard specifies mechanisms such that, first, power is not supplied unless an electrical vehicle is connected and, second, the electrical vehicle is immobilized while still connected. IEC 62196 incorporates as connector types SAE J1772, known colloquially as the Yazaki connector (IEC Type 1) in North America; VDE-AR-E 2623-2-2, known colloquially as the Mennekes connector (IEC Type 2), in Europe; EV Plug Alliance proposal, colloquially known as the Scame connector (IEC Type 3), in Italy and France; and JEVS G105-1993, with the trade name, CHAdeMO (IEC Type 4), in Japan.

In another preferred implementation, the electrical vehicle PE loss detection method comprises the step: charging the electrical vehicle with electrical energy, and/or if interruption of the PE line is detected, stopping charging the electrical vehicle and/or depending on the observed change, determining if the EVSE is charging or is not charging the electrical vehicle. Thus, if the proposed method detects PE loss, charging of the electrical vehicle is interrupted for example by shutting down respectively disconnecting or interrupting electrical energy supply to the electrical vehicle, electrically disconnecting the electrical vehicle, the AC grid, a transformer and/or inverter provided with the EVSE, shutting down the EVSE etc. Such way dangerous arcs and/or hazardous overvoltage can be avoided. In a further preferred implementation, it is advantageous that charging is stopped within 30 milliseconds since detection of the interruption. As described before, depending on the PP line voltage level and/or amplitude of the AC component and/or the PWM signal it can be determined if the EVSE is charging or is not charging the electrical vehicle.

According to a further preferred implementation, the electrical vehicle PE loss detection method comprises the step: Detecting interruption of the PE line by observing a change of the CP signal, in particular of the CP signal voltage level. By observing both a change of the CP signal and the PP signal in parallel, the proposed method allows in a very reliant manner the detection of an interruption PE line e.g. a broken PE line, PE signal lost or PE loss. Such way charging can be interrupted in order to avoid damages of the Electrical Vehicle Supply Equipment, the charging connector, the charging cable and/or the electrical vehicle.

The object is further solved by the charging connector configured for detecting PE loss according to the electrical vehicle PE loss detection method as described before. The charging connector preferably comprises at least a PP conductor as PP line respectively for transmitting the PP signal, a CP conductor as CP signal line respectively for transmitting the CP signal and a PE conductor as PE line for transmitting the PE signal. The charging connector preferably comprises further conductors for submitting electrical energy.

The object is even further solved by the charging cable configured for detecting PE loss according to the electrical vehicle PE loss detection method as described before. Preferably, one end of the charging cable is firmly connected to the Electrical Vehicle Supply Equipment, while the charging connector is connected to the other end. The charging cable preferably comprises at least a PP conductor as PP line respectively for transmitting the PP signal, a CP conductor as CP signal line respectively for transmitting the CP signal and a PE conductor as PE line for transmitting the PE signal. The charging cable preferably comprises further conductors for submitting electrical energy.

The object is further solved by the Electrical Vehicle Supply Equipment configured for detecting PE loss according to the electrical vehicle PE loss detection method of any of the above. The EVSE is preferably provided as a charger or a charging station connected to an energy source such an AC grid and configured for providing electrical energy for charging at least one or a plurality of electrical vehicles. Further preferably, the EVSE comprise the charging cable attached thereto and/or the charging connector for connecting the electrical vehicle.

FIG. 1 shows a normal signal flow between an Electrical Vehicle Supply Equipment, EVSE, 1, a charging connector 2, a charging cable 3 and an electrical vehicle 4 in a schematic view. The EVSE 1 charges the electrical vehicle 4 via conductors with electrical energy provided via the charging cable 3 and the charging connector 2 plugged into an electrical vehicle interface of the electrical vehicle. Thereby, charging is accomplished via the Combined Charging System, CCS, protocol according to standard IEC 61851-23.

Said protocol defines that the EVSE 1 communicates with the electrical vehicle 4 via the charging cable 3 and the charging connector 2 by using a Proximity Pilot, PP, line for a PP signal and a Control Pilot, CP, line for a CP signal line besides a Protective Earth, PE, line for a PE signal. CP and PE lines are used by the EVSE 1 for executing a continuity check, as illustrated in the upper portion of FIG. 1 with a dashed line. PP and PE lines are used by the electrical vehicle 4 for executing a locking check of the charging connector 2, as illustrated in the lower portion of FIG. 1 with a dashed line. PE lines in the upper and lower portions of FIG. 1 are connected to each other, for example via a chassis of the electrical vehicle 4. PE, PP and CP lines are as well provided as conductors and included the in the common charging cable 3 with respective pins at the charging connector 2, together with the conductors for transmitting electrical energy for charging the electrical vehicle 4.

Figure 2:
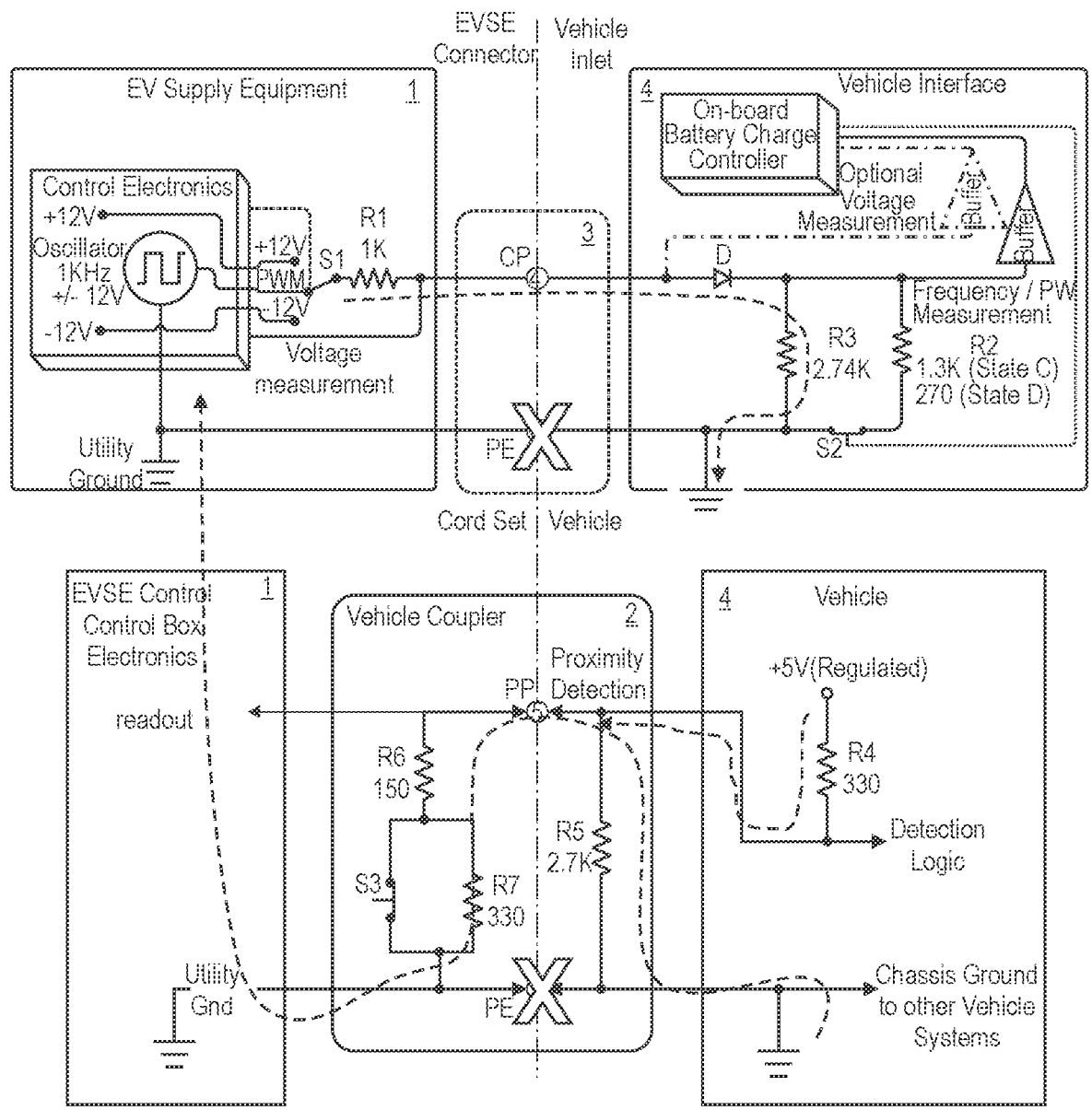
FIG. 2 shows an abnormal signal flow between the EVSE, the charging connector, the charging cable and the electrical vehicle of FIG. 1 for executing a Protective Earth, PE, loss detection method according to a preferred embodiment of the invention in a schematic view.

During normal operation, as shown in FIG. 1, a ground loss detection can be executed by using the CP line. However, if the PE line between the EVSE 1 and the electrical vehicle 4 is broken, as shown in FIG. 2 indicated by two "X" at the PE line, a ground loss detection by using the CP line may fail, as a return CP current will not flow via PE as during normal operation but instead via PP resistors in the charging connector 2. Thus, a signal flow as shown in FIG. 2 with the dashed lines happen. As a result, EVSE 1 cannot detect PE continuity by observing the CP line. Checking PE continuity by observing the PP line solves said problem. Thus, by observing a change of the PP signal an interruption of the PE line can be detected, as explained in the following and as illustrated in FIGS. 3 and 4.

Figure 3:
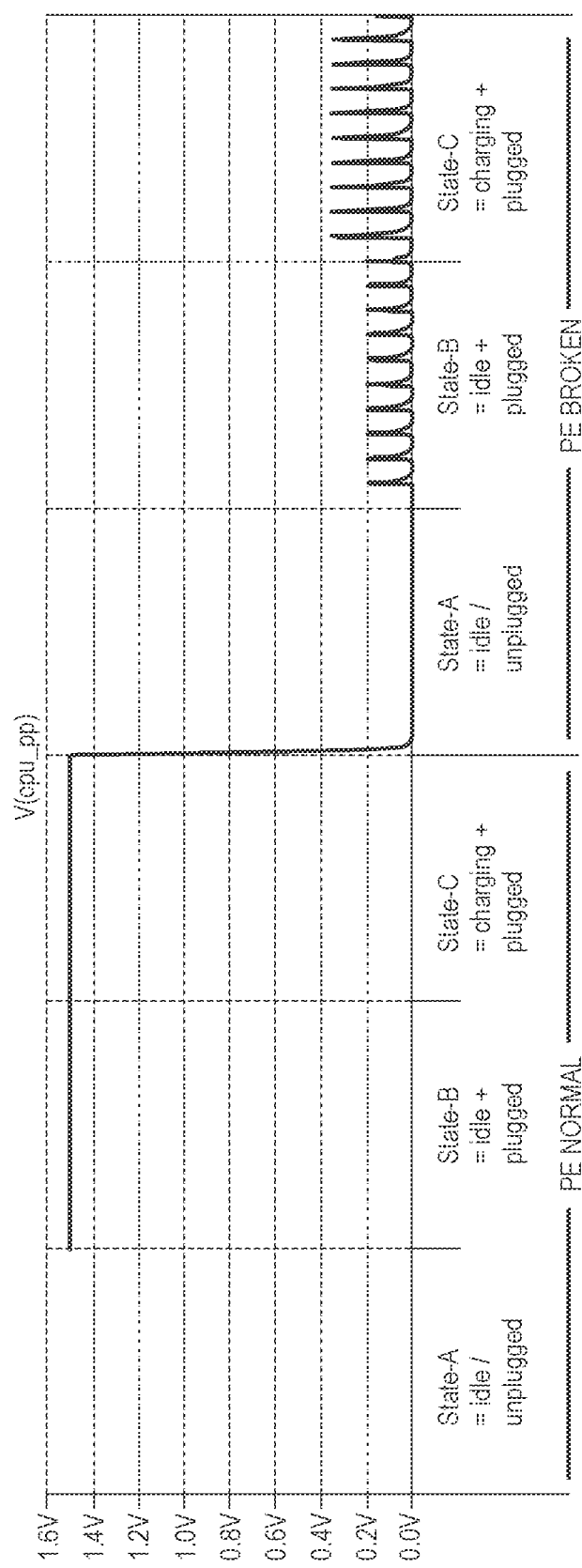
FIG. 3 shows an expected Proximity Pilot, PP, line voltage according to the preferred embodiment of the invention for a US/CSS1 protocol as a diagram.

FIG. 3 shows PP line voltages in various situations for a US/CCS1 protocol. On the left side, three different situations are shown for normal operation i.e. with an unbroken, fully operable PE line. In each of the three situations (A) idle respectively not charging the electrical vehicle 4 with unplugged charging connector 2, (B) idle respectively not charging the electrical vehicle 4 with charging connector 2 plugged into the electrical vehicle 4 and (C) charging the electrical vehicle 4 with charging connector 2 plugged into the electrical vehicle 4 the PP line voltage is approximately 1.5 V steady.

The right side of FIG. 3 shows again the three situations (A), (B) and (C) for a broken PE line i.e. during loss or interruption of the PE line. In situation (A), the PP line voltage is zero respectively reaches zero after a few milliseconds. Situation (A) can be determined by observing a change of the CP signal. Situations (B) and (C) both show a clear shift in DC levels, however, also comprise an additional AC component respectively fluctuation. Said fluctuation is a residue from a Pulse Width Modulation, PWM, on the CP line, which has a frequency of 1 kHz +12V/−12V PWM of 5% pulse width. Thereby, the amplitude of the AC component is around 50% higher during charging compared to not charging the electrical vehicle 4. In any case situations (B) and (C) comprise a reduction in the DC level by more than 50%. For detecting the PP line voltage, the EVSE 1 may be equipped with a respective readout circuitry such as a voltmeter or the like.

Figure 4:
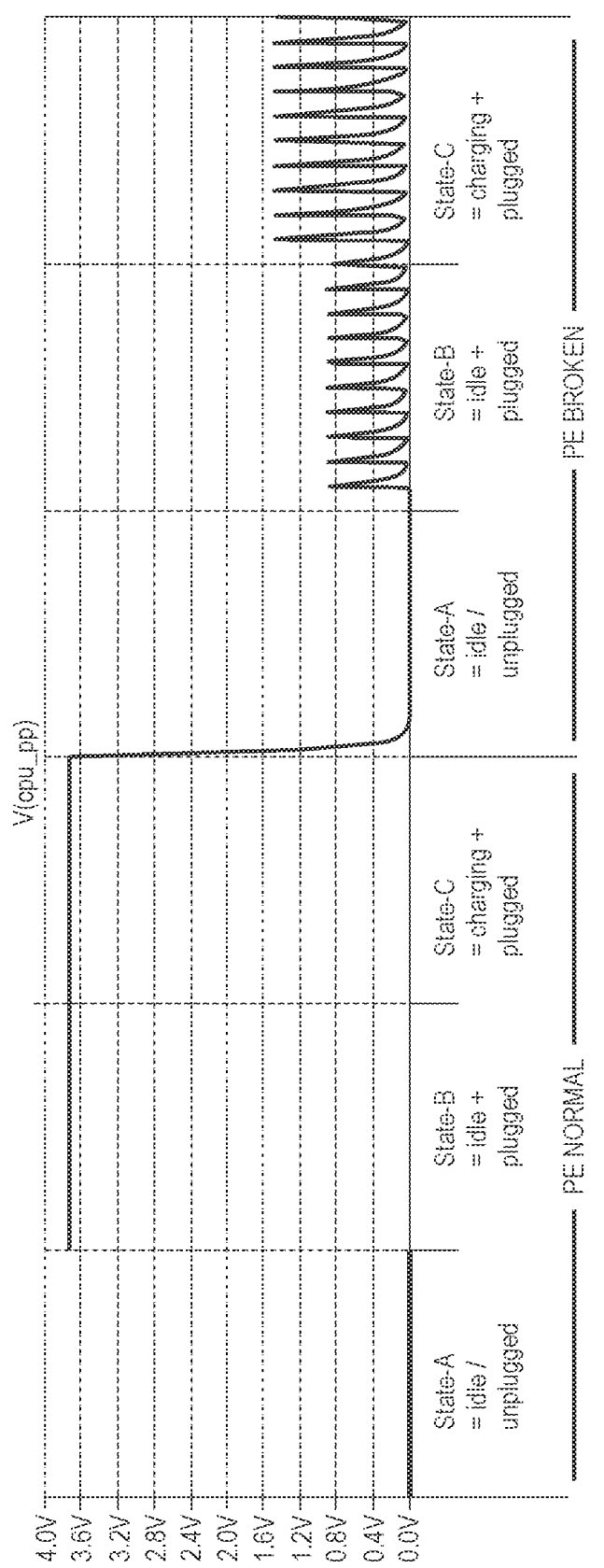
FIG. 4 shows an expected Proximity Pilot, PP, line voltage according to the preferred embodiment of the invention for an EU/CSS2 protocol as a diagram.

FIG. 4 shows an analogous diagram than FIG. 3 for an EU/CCS2 protocol. Difference between the EU/CCS2 and US/CCS1 protocols is that for EU/CCS2 implementation R6 is 1500Ω and S3 is not present i.e. always closed, cf. FIGS. 1 and 2. S3 is used for issuing a stop-charge request, which is implemented for EU/CCS2 by an additional button in the charging connector 2. As long as this button is not pressed, the described method applies. If the button is pressed, charging will stop anyway, so this situation needs no further description.

In any cases of (B) and (C) and both for EU/CCS2 and US/CCS1 protocols, at least a change of the DC amplitude of the measured PP signal indicates for an unplugged status a broken PE line. For a plugged status, an additional DC component is present in the measured PP signal, indicating said interruption of the PE line. In all cases (B) and (C) sufficient margin is left for switching off charging i.e. by shutting down the EVSE 1 or disconnecting the conductors at the EVSE 1 providing electrical energy to the electrical vehicle 4 within 30 milliseconds as defined by the standard. Thus, the proposed method allows a reliable detection of PE loss by observing the PP line, in addition to observing the CP line, such as a change of the DC amplitude and/or presence of an AC component.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS LIST

1 Electrical Vehicle Supply Equipment, EVSE
2 Charging connector
3 Charging cable
4 Electrical vehicle

What is claimed is:

1. A Protective Earth (PE) loss detection method for charging an electrical vehicle comprising an Electrical Vehicle Supply Equipment (EVSE), a charging connector, and/or a charging cable comprising at least a Proximity Pilot (PP) line for a PP signal, a Control Pilot (CP) line for a CP signal and a PE line for a PE signal, the method comprising:
 detecting interruption of the PE line by observing a change of the PP signal wherein the change comprises a different direct current (DC) level of ≤40, 50 or 60% of a DC level of an uninterrupted PE line.

2. The PE loss detection method of claim 1, wherein the change further comprises an alternating current (AC) component and/or a pulse width modulated (PWM) signal.

3. The PE loss detection method of claim 2, wherein the AC component and/or the PWM signal comprises a peak to peak amplitude of ≥0.1 V or ≥0.3 V and ≤0.3 V, ≤0.4 V or ≤0.6 V or comprises a peak to peak amplitude of ≥0.4 V or ≥1.0 V and ≤1.2 V, ≤1.6 V or ≤2.0 V.

4. The PE loss detection method of claim 2, wherein the AC component and/or PWM signal comprises a frequency in the range of 1 kHz or a frequency ≥0.9 kHz and ≤1.1 kHz.

5. The PE loss detection method of claim 1, wherein a charging protocol for the electrical vehicle is according to International Electrotechnical Commission (IEC) 61851.

6. The PE loss detection method of claim 5, wherein the charging protocol for the electrical vehicle is according to International Electrotechnical Commission (IEC) 61851-23.

7. The PE loss detection method of claim 1, wherein the charging connector is provided according to International Electrotechnical Commission (IEC) 62196.

8. The PE loss detection method of claim 1, wherein the method further comprises:
 charging the electrical vehicle with electrical energy.

9. The PE loss detection method of claim 1, wherein the method further comprises:
 based on detecting interruption of the PE line, providing a notification of the detected interruption of the PE line; and/or
 based on detecting interruption of the PE line, stop charging the electrical vehicle.

10. The PE loss detection method of claim 1, wherein the method further comprises:
 based on the observed change, determining whether the EVSE is charging or is not charging the electrical vehicle.

11. The PE loss detection method of claim 1, wherein the method further comprises:
 charging the electrical vehicle with electrical energy;
 based on detecting interruption of the PE line, stop charging the electrical vehicle; and
 based on the observed change, determining whether the EVSE is charging or is not charging the electrical vehicle.

12. The PE loss detection method of claim 11, wherein charging is stopped within 30 milliseconds from detection of the interruption.

13. The PE loss detection method of claim 1, wherein the method further comprises:
   detecting interruption of the PE line by observing a change of the CP signal.

14. The PE loss detection method of claim 1, wherein the charging connector is configured to detect a PE loss.

15. The PE loss detection method of claim 1, wherein the charging cable is configured to detect a PE loss.

16. The PE loss detection method of claim 1, wherein the EVSE is configured to detecting a PE loss.

17. The PE loss detection method of claim 1, wherein the charging connector is provided according to the International Electrotechnical Commission (IEC) 62196 standard.

18. A Protective Earth (PE) loss detection method for charging an electrical vehicle comprising an Electrical Vehicle Supply Equipment (EVSE), a charging connector, and a charging cable comprising at least a Proximity Pilot (PP) line for a PP signal, a Control Pilot (CP) line for a CP signal and a PE line for a PE signal, the method comprising:
   detecting interruption of the PE line by observing a change of the PP signal while the CP line is uninterrupted, wherein the change comprises a different direct current (DC) level of ≤0.3 V, ≤0.4 V or ≤0.6 V using a CCS1 protocol or of ≤1.2 V, ≤1.6 V or ≤2.0 V using a CCS2 protocol.

19. The PE loss detection method of claim 18, wherein the method further comprises:
   based on detecting interruption of the PE line, providing a notification of the detected interruption of the PE line; and/or
   based on detecting interruption of the PE line, stop charging the electrical vehicle.

20. A Protective Earth (PE) loss detection method for charging an electrical vehicle comprising an Electrical Vehicle Supply Equipment (EVSE), a charging connector, and a charging cable comprising at least a Proximity Pilot (PP) line for a PP signal, a Control Pilot (CP) line for a CP signal and a PE line for a PE signal, the method comprising:
   detecting interruption of the PE line by observing a change of the PP signal while the CP line is uninterrupted, wherein the change comprises:
   a different direct current (DC) level, which is ≤60% of a DC level of an uninterrupted PE line, or
   an alternating current (AC) component and/or a pulse width modulated (PWM) signal.

21. The PE loss detection method of claim 20, wherein the method further comprises:
   based on detecting interruption of the PE line, providing a notification of the detected interruption of the PE line; and/or
   based on detecting interruption of the PE line, stop charging the electrical vehicle.

* * * * *